(12) United States Patent
Kobayashi et al.

(10) Patent No.: US 9,716,014 B2
(45) Date of Patent: Jul. 25, 2017

(54) METHOD OF PROCESSING WORKPIECE (71) Applicant: TOKYO ELECTRON LIMITED, Tokyo (JP)

(72) Inventors: Fumiya Kobayashi, Hwaseong-si (KR); Masahiro Ogasawara, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/149,501

(22) Filed: May 9, 2016

(65) Prior Publication Data
US 2016/0336197 A1 Nov. 17, 2016

(30) Foreign Application Priority Data

May 11, 2015 (JP) ................................. 2015-096279

(51) Int. Cl.
*H01L 21/3213* (2006.01)
(52) U.S. Cl.
CPC .. *H01L 21/32136* (2013.01); *H01L 21/32137* (2013.01)
(58) Field of Classification Search
CPC ......... H01L 21/32136; H01L 21/32137; H01L 21/32139
See application file for complete search history.

(56) References Cited

U.S. PATENT DOCUMENTS

2007/0281479 A1* 12/2007 Lee .................. H01L 21/28273
438/689

FOREIGN PATENT DOCUMENTS

JP 2014-203912 A 10/2014

* cited by examiner

*Primary Examiner* — Nadine Norton
*Assistant Examiner* — Mahmoud Dahimene
(74) *Attorney, Agent, or Firm* — Studebaker & Brackett PC (57) ABSTRACT

A method according to an embodiment includes (i) a step of preparing a workpiece in a processing container of a plasma processing apparatus, (ii) a first plasma processing step of generating a plasma of a first processing gas, which contains chlorine, in the processing container, (iii) a second plasma processing step of generating a plasma of a second processing gas, which contains fluorine, in the processing container, and (iv) a third plasma processing step of generating a plasma of a third processing gas, which contains oxygen, in the processing container. A plurality of sequences, each of which includes the first plasma processing step, the second plasma processing step, and the third plasma processing step, are performed.

11 Claims, 12 Drawing Sheets

METHOD OF PROCESSING WORKPIECE

CROSS-REFERENCE TO RELATED APPLICATIONS

This application is based on and claims the benefit of priority from Japanese Patent Application No. 2015-096279 filed on May 11, 2015, the entire contents of which are incorporated herein by reference.

BACKGROUND

Field

Exemplary Embodiments of the present disclosure relate to a method of processing a workpiece, and particularly, to a method including etching of a tungsten-containing film.

Related Background Art

When manufacturing an electronic device such as a semiconductor device, etching is performed with respect to an etching target layer by plasma processing to form an opening in the etching target layer. In the etching, it is required to form an opening having a high aspect ratio. That is, it is required to form an opening that is narrow and deep.

In order to form an opening having a high aspect ratio, it is necessary to reduce consumption of a mask on the etching target layer during the etching of the etching target layer. To this end, etching is performed with respect to a tungsten film to form a mask. Typically, the tungsten film is etched with a plasma of a processing gas including chlorine gas. The etching of the tungsten film is disclosed in, for example, Japanese Patent Application Laid-Open Publication No. 2014-203912.

When a film containing tungsten (hereinafter, referred to as "tungsten-containing film") is etched with the plasma of the processing gas including chlorine gas, tungsten chloride is formed through a reaction between tungsten and chlorine. Tungsten chloride has low volatility, and adheres to a workpiece. As a result, an opening, which is formed in the tungsten-containing film, has a tapered shape. That is, an opening, in which a width at a deep position is smaller than a width at a shallow position, is formed. Accordingly, there is a demand for a technology of forming an opening having high verticality in the tungsten-containing film.

SUMMARY

In one aspect, there is provided a method of processing a workpiece having a tungsten-containing film and a mask provided on the tungsten-containing film. The method includes (i) preparing the workpiece in a processing container of a plasma processing apparatus, (ii) generating a plasma of a first processing gas, which contains chlorine, in the processing container (hereinafter, also referred to as "first plasma processing step"), (iii) generating a plasma of a second processing gas, which contains fluorine, in the processing container (hereinafter, also referred to as "second plasma processing step"), and (iv) generating a plasma of a third processing gas, which contains oxygen, in the processing container (hereinafter, also referred to as "third plasma processing step"). In the method, a plurality of sequences, each of which includes the first plasma processing step, the second plasma processing step, and the third plasma processing step, are performed.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

DETAILED DESCRIPTION

In the following detailed description, reference is made to the accompanying drawings, which form a part hereof. The exemplary embodiments described in the detailed description, drawing, and claims are not meant to be limiting. Other exemplary embodiments may be utilized, and other changes may be made, without departing from the spirit or scope of the subject matter presented here.

In one aspect, there is provided a method of processing a workpiece having a tungsten-containing film and a mask provided on the tungsten-containing film. The method includes (i) preparing the workpiece in a processing container of a plasma processing apparatus, (ii) generating a plasma of a first processing gas, which contains chlorine, in the processing container (hereinafter, also referred to as "first plasma processing step"), (iii) generating a plasma of a second processing gas, which contains fluorine, in the processing container (hereinafter, also referred to as "second plasma processing step"), and (iv) generating a plasma of a third processing gas, which contains oxygen, in the processing container (hereinafter, also referred to as "third plasma processing step"). In the method, a plurality of sequences, each of which includes the first plasma processing step, the second plasma processing step, and the third plasma processing step, are performed.

In the first plasma processing step of the method according to the aspect, the tungsten-containing film is etched at a portion that is exposed from the mask, and a reaction product of chlorine and tungsten, that is, tungsten chloride is generated. The reaction product adheres to the workpiece. In the subsequent second plasma processing step, chlorine and tungsten fluoride are generated through a reaction between tungsten chloride and fluorine. In addition, tungsten fluoride is also generated through a reaction between tungsten in the tungsten-containing film and fluorine. The generated chlorine and tungsten fluoride are exhausted. In the subsequent third plasma processing step, an exposed surface of the tungsten-containing film, that is, a wall surface defining an opening is oxidized. In the method, a sequence including the first plasma processing step, the second plasma processing step, and the third plasma processing step is repetitively performed. According to the method, a lateral wall surface defining the opening is protected by an oxide film, and tungsten fluoride, which easily volatilizes, is formed from tungsten chloride. Accordingly, an opening having high verticality is formed in the tungsten-containing film.

In the plurality of sequences in the method in an embodiment, a temperature of the workpiece may be set to a temperature of 50° C. or higher. When the plurality of sequences are performed in a condition in which the temperature of the workpiece is set to such a temperature, the verticality of the opening formed in the tungsten-containing film further increases.

In an embodiment, the first processing gas may include a chlorine gas. In addition, the first processing gas may further include a nitrogen gas and/or an oxygen gas. In an embodiment, the second processing gas may include at least one of a fluorocarbon gas and a nitrogen trifluoride gas. In addition, the second processing gas may further include an oxygen gas. In an embodiment, the third processing gas may include an oxygen gas. In addition, the third processing gas may further include a nitrogen gas.

In the second plasma processing step in an embodiment, a pressure of a space inside the processing container may be set to a pressure of 20 mTorr (2.666 Pa) or lower. Under the pressure environment, exhaustion of tungsten fluoride is further promoted.

In an embodiment, the workpiece may further have a polycrystal silicon layer, and the tungsten-containing film may be provided on the polycrystal silicon layer. In the embodiment, the method may further include etching the polycrystal silicon layer.

As described above, it is possible to form an opening having high verticality in a tungsten-containing film.

Hereinafter, various exemplary embodiments will be described in detail with reference to the accompanying drawings. In the drawings, the same reference numerals will be given to the same portions or equivalent portions.

Figure 1:
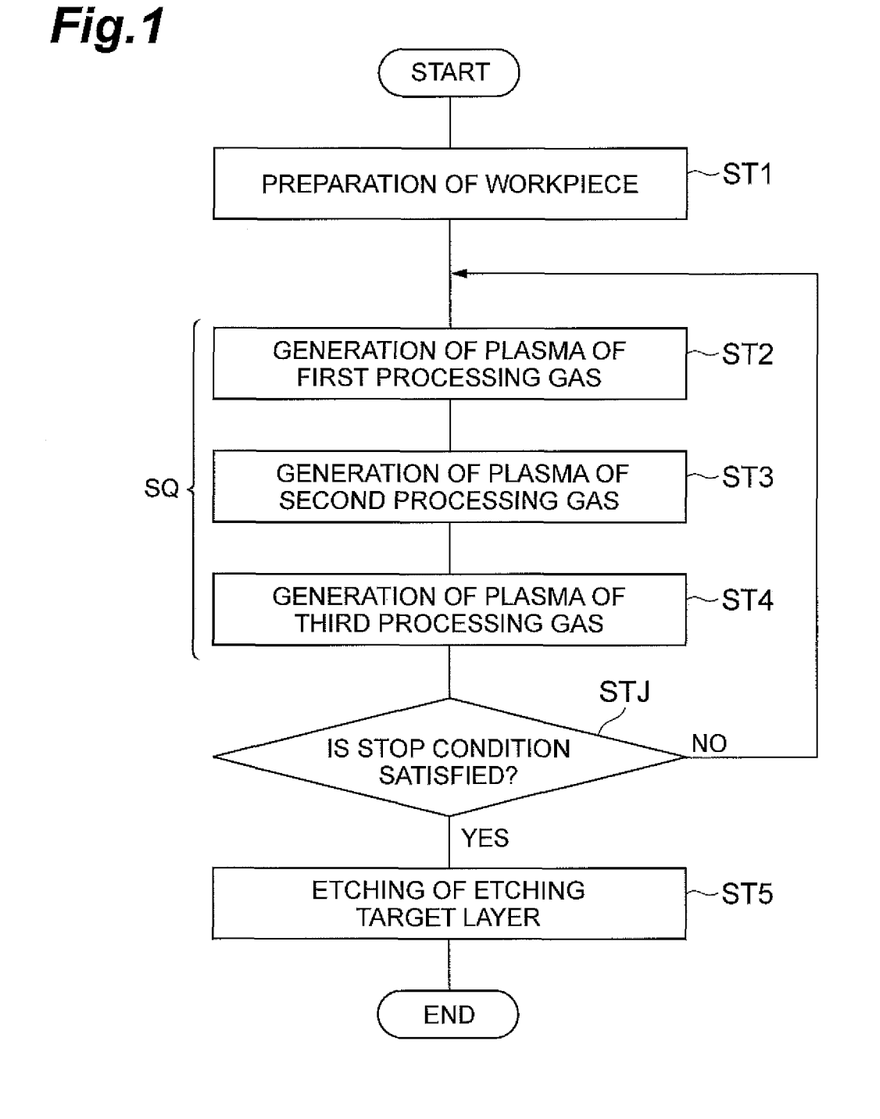
FIG. 1 is a flowchart illustrating an exemplary embodiment of a method of processing a workpiece.
Figure 2:
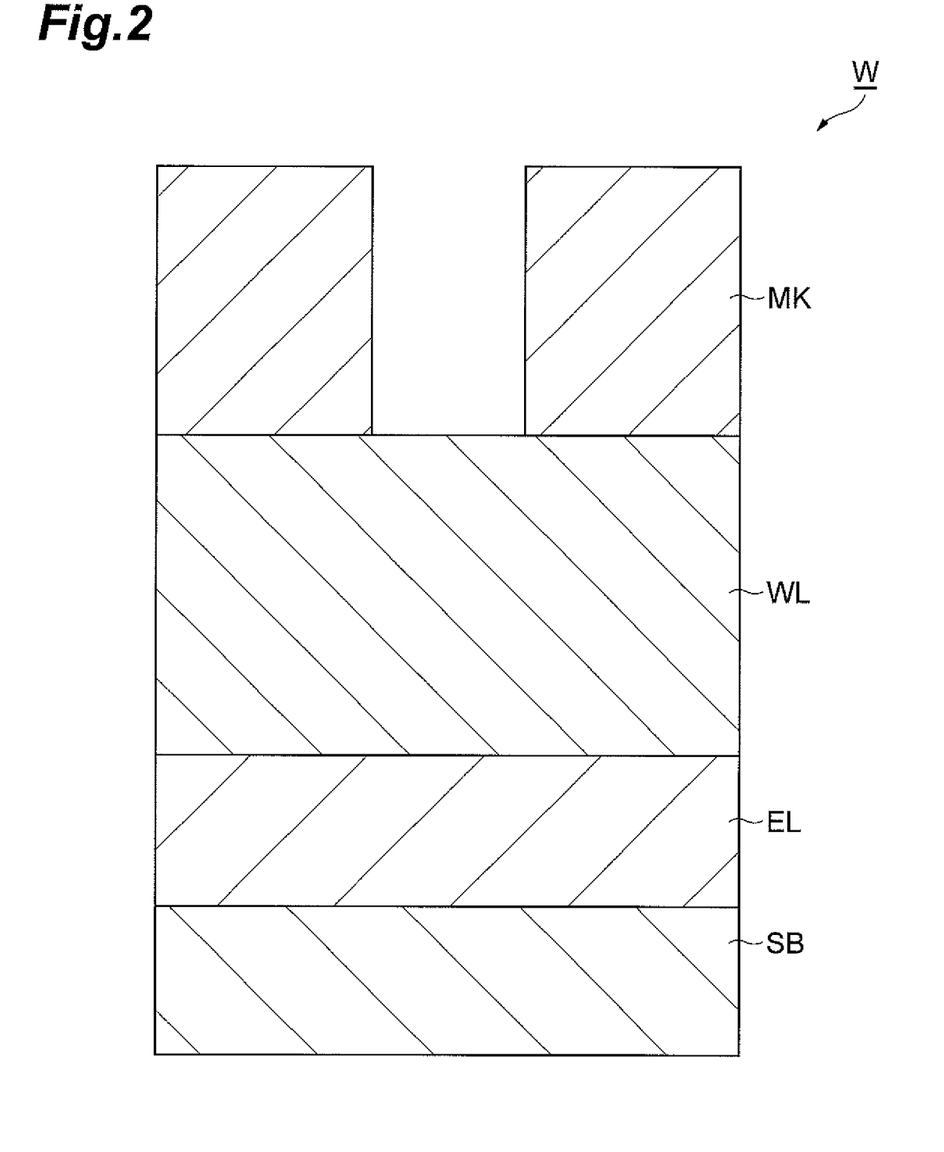
FIG. 2 is a cross-sectional view illustrating an exemplary workpiece that can be processed by the method illustrated in FIG. 1.

FIG. 1 is a flowchart illustrating an exemplary embodiment of a method of processing a workpiece. A method MT illustrated in FIG. 1 is a method including etching of a tungsten-containing film. FIG. 2 is a cross-sectional view illustrating an exemplary workpiece that can be processed by the method illustrated in FIG. 1. The workpiece (hereinafter, may be referred to as "wafer W") illustrated in FIG. 2 includes a substrate SB, a etching target layer EL, a tungsten-containing film WL, and a mask MK.

The etching target layer EL is provided on the substrate SB. For example, the etching target layer EL is a polycrystal silicon layer. The tungsten-containing film WL is provided on the etching target layer EL. The tungsten-containing film WL is a film containing tungsten.

The tungsten-containing film WL may be a tungsten single film that is formed from only tungsten. Alternatively, the tungsten-containing film WL may be a film that is formed from tungsten and other elements, and examples thereof include a tungsten silicide (WSi) film, a tungsten nitride (WN) film, and the like. The tungsten-containing film WL may have a thickness of, for example, 100 nm or greater. The mask MK is provided on the tungsten-containing film WL. The mask MK is formed from a material having resistance against etching of the tungsten-containing film WL. As an example, the mask MK is formed from silicon oxide. The mask MK has a pattern that is transferred to the tungsten-containing film WL, and an opening such as a hole is formed in the mask MK. The opening of the mask MK may have a width of, for example, 30 nm. Such a pattern of the mask MK can be formed, for example, by photolithography and plasma etching. Hereinafter, description will be given of the method MT with reference to a case in which the wafer W is processed.

Figure 3:
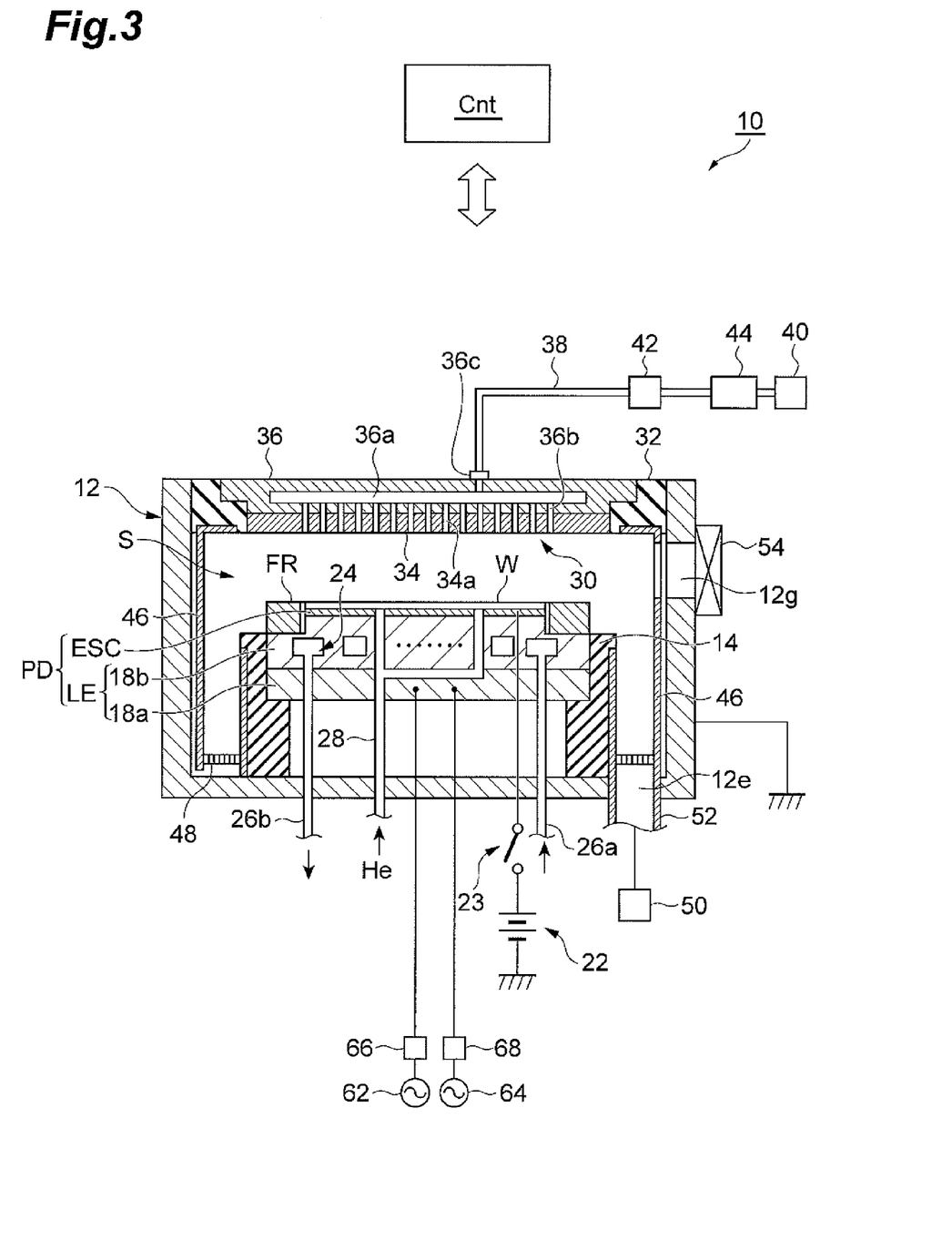
FIG. 3 is a view schematically illustrating an exemplary plasma processing apparatus that can be used for performing the method illustrated in FIG. 1.

In the method MT, the wafer W is prepared in a processing container of a plasma processing apparatus in a step ST1. FIG. 3 is a view schematically illustrating an exemplary plasma processing apparatus that can be used for performing the method illustrated in FIG. 1. FIG. 3 schematically illustrates a structure on a longitudinal cross-section of the plasma processing apparatus 10. The plasma processing apparatus 10 is a capacitively coupled plasma etching apparatus. The plasma processing apparatus 10 includes a processing container 12. The processing container 12 may have a substantially cylindrical shape. The processing container 12 is formed from, for example, aluminum. An inner wall surface of the processing container 12 is subjected to processing such as anodic oxidation. The processing container 12 is grounded.

On the bottom of the processing container 12, a support 14 having a substantially cylindrical shape is provided. The support 14 is formed from, for example, an insulating material. At the inside of the processing container 12, the support 14 extends in a vertical direction from the bottom of the processing container 12. A pedestal PD is provided in the processing container 12. The pedestal PD is supported by the support 14.

The pedestal PD is configured to retain the wafer W on an upper surface thereof. The pedestal PD includes a lower electrode LE and an electrostatic chuck ESC. The lower electrode LE includes a first plate 18a and a second plate 18b. The first plate 18a and the second plate 18b are formed from a metal such as aluminum, and have an substantially disk shape. The second plate 18b is provided on the first plate 18a and is electrically connected to the first plate 18a.

The electrostatic chuck ESC is provided on the second plate 18b. The electrostatic chuck ESC has a structure in which an electrode, which is a conductive film, is disposed between a pair of insulating layers or insulating sheets. A DC power supply 22 is electrically connected to the electrode of the electrostatic chuck ESC via a switch 23. The electrostatic chuck ESC attracts the wafer W with an electrostatic force such as a coulomb force that is generated due to a DC voltage from the DC power supply 22. Accordingly, the electrostatic chuck ESC can retain the wafer W. At the inside of the electrostatic chuck, a heater may be provided.

A focus ring FR is disposed on a peripheral portion of the second plate 18b to surround an edge of the wafer W and the electrostatic chuck ESC. The focus ring FR is provided to improve uniformity of etching. The focus ring FR is formed from a material that is appropriately selected in accordance with a material of a film to be etched, and may be formed from quartz.

A coolant flow passage 24 is provided at the inside of the second plate 18b. The coolant flow passage 24 configures a temperature adjusting mechanism. A coolant is supplied to the coolant flow passage 24 from a chiller unit, which is provided outside the processing container 12, through a pipe 26a. The coolant, which is supplied to the coolant flow passage 24, is returned to the chiller unit through a pipe 26b. In this way, the coolant is supplied to the coolant flow passage 24 to circulate in the coolant flow passage 24. By controlling a temperature of the coolant, a temperature of the wafer W supported by the electrostatic chuck ESC is controlled.

In addition, a gas supply line 28 is provided to the plasma processing apparatus 10. The gas supply line 28 supplies a heat transfer gas, for example, a He gas, from a heat transfer gas supply mechanism to a space between an upper surface of the electrostatic chuck ESC and a back surface of the wafer W.

In addition, the plasma processing apparatus 10 includes an upper electrode 30. The upper electrode 30 is disposed on an upper side of the pedestal PD to face the pedestal PD. The lower electrode LE and the upper electrode 30 are provided to be substantially parallel to each other. Between the upper electrode 30 and the pedestal PD, a processing space S in which plasma processing is applied to the wafer W is provided.

The upper electrode 30 is supported on an upper side of the processing container 12 through an insulating shielding member 32. The upper electrode 30 may include a ceiling plate 34 and a ceiling plate support 36. The ceiling plate 34 faces a processing space S, and a plurality of gas ejection holes 34a are provided in the ceiling plate 34. The ceiling plate 34 may be formed from silicon or quartz.

The ceiling plate support 36 detachably supports the ceiling plate 34, and may be formed from a conductive material such as aluminum. The ceiling plate support 36 may have a water-cooling structure. A gas diffusion chamber 36a is provided at the inside of the ceiling plate support 36. A plurality of gas flow holes 36b, which communicate with the gas ejection holes 34a, extend downward from the gas diffusion chamber 36a. In addition, a gas introduction port 36c, which guides a processing gas to the gas diffusion chamber 36a, is formed in the ceiling plate support 36, and a gas supply pipe 38 is connected to the gas introduction port 36c.

A gas source group 40 is connected to the gas supply pipe 38 through a valve group 42 and a flow controller group 44. The gas source group 40 includes a plurality of gas sources. The plasma processing apparatus 10 is configured to selectively supply a first processing gas, a second processing gas, a third processing gas, and a fourth processing gas for etching of the etching target layer EL from the plurality of gas sources.

The first processing gas contains chlorine. In one embodiment, the first processing gas includes a chlorine ($Cl_2$) gas. The first processing gas may further include a nitrogen ($N_2$) gas and/or an oxygen gas. The second processing gas contains fluorine. In one embodiment, the second processing gas includes at least one of a fluorocarbon gas and a nitrogen trifluoride gas. For example, the fluorocarbon gas is a $CF_4$ gas. In addition, the second processing gas may further include an oxygen ($O_2$) gas. The third processing gas contains oxygen. In one embodiment, the third processing gas includes an oxygen gas. The third processing gas may further include a nitrogen gas. In one embodiment, the fourth processing gas includes a hydrogen bromide gas.

The plurality of gas sources of the gas source group 40 include gas sources of a chlorine gas, a nitrogen gas, a fluorocarbon gas, a nitrogen trifluoride gas, an oxygen gas, and a hydrogen bromide gas, respectively, to supply the processing gases. In addition, the plurality of gas sources may further include a source of a rare gas such as a He gas, a Ne gas, an Ar gas, a Kr gas, or an Xe gas.

The valve group 42 includes a plurality of valves, and the flow controller group 44 includes a plurality of flow controllers such as a mass flow controller. The plurality of gas sources of the gas source group 40 are connected to the gas supply pipe 38 through the valves of the valve group 42, and the flow controllers of the flow controller group 44, respectively.

In the plasma processing apparatus 10, a deposition shield 46 is detachably provided along an inner wall of the processing container 12. The deposition shield 46 is also provided to an outer periphery of the support 14. The deposition shield 46 prevents an etching by-product (i.e. deposition) from adhering to the processing container 12, and may be formed by coating an aluminum material with ceramics such as $Y_2O_3$.

An exhaustion plate 48 is provided on a bottom side of the processing container 12 and between the support 14 and a lateral wall of the processing container 12. The exhaustion plate 48 is formed from, for example, aluminum, and a surface thereof is coated with ceramics such as yttrium oxide. A plurality of through-holes are formed in the exhaustion plate 48. An exhaustion port 12e is provided to the processing container 12 on a lower side of the exhaustion plate 48. An exhaustion device 50 is connected to the exhaustion port 12e through an exhaustion pipe 52. The exhaustion device 50 includes a pressure adjustment valve, and a vacuum pump such as a turbo-molecular pump. The exhaustion device 50 can depressurize a space inside the processing container 12 to a desired degree of vacuum. In addition, a transfer port 12g for the wafer W is provided in the lateral wall of the processing container 12, and the transfer port 12g can be opened and closed by a gate valve 54.

In addition, the plasma processing apparatus 10 further includes a first high-frequency power supply 62 and a second high-frequency power supply 64. The first high-frequency power supply 62 is a power supply that generates a high frequency wave for generation of a plasma. The first high-frequency power supply 62 generates a high frequency wave having a frequency in a range of 27 MHz to 100 MHz, for example, 100 MHz. The first high-frequency power supply 62 is connected to the lower electrode LE through the matcher 66. The matcher 66 includes a circuit configured to match output impedance of the first high-frequency power supply 62 and input impedance on a load side (on a lower electrode LE side).

In one embodiment, the first high-frequency power supply 62 can continuously supply a high frequency wave to the lower electrode LE. That is, the first high-frequency power supply 62 can supply a high-frequency wave, which is a continuous wave, to the lower electrode LE. In addition, the first high-frequency power supply 62 can supply a pulse-modulated high-frequency wave to the lower electrode LE. That is, the first high-frequency power supply 62 can alternately switch power of the high-frequency wave between a first power and a second power that is lower than the first power. For example, the second power may be 0 W. A modulation frequency in the pulse modulation is a frequency of, for example, 0.1 kHz to 100 kHz. In addition, a proportion of a duration, for which the high-frequency wave has the first power, in one cycle of the pulse modulation, that is, a duty ratio is 5% to 90%.

The second high-frequency power supply 64 is a power supply that generates a high-frequency bias for attracting ions to the wafer W, and generates a high-frequency bias having a frequency in a range of 400 kHz to 13.56 MHz, for example, 13.56 MHz. The second high-frequency power supply 64 is connected to the lower electrode LE through a matcher 68. The matcher 68 includes a circuit configured to match output impedance of the second high-frequency power supply 64 and input impedance on the load side (on the lower electrode LE side). In one embodiment, as is the case with the first high-frequency power supply 62, the second high-frequency power supply 64 may supply a high-frequency bias, which is a continuous wave, to the lower electrode LE, or may supply a pulse-modulated high-frequency bias to the lower electrode LE.

In one embodiment, the plasma processing apparatus 10 may further include a controller Cnt. The controller Cnt is a computer provided with a processor, a storage unit, an input device, a display device, and the like, and controls respective units of the plasma processing apparatus 10. The controller Cnt can allow an operator to perform a command input operation and the like to manage the plasma processing apparatus 10 by using an input device, and can visually display an operational status of the plasma processing apparatus 10 on the display device. In the storage unit of the controller Cnt, a control program allowing the processor to control various kinds of processing which are performed in the plasma processing apparatus 10, or a program allowing the respective units of the plasma processing apparatus 10 to perform processing in accordance with processing conditions, that is, processing recipes are stored. In one embodiment, the controller Cnt can control respective units of the plasma processing apparatus 10 on the basis of a processing recipe for performing of the method MT.

Description will be given of the method MT with reference to FIG. 1. In the following description, the method MT will be described in accordance with an example that is performed by using the plasma processing apparatus 10. In addition, the following description will be made with reference to FIG. 4 to FIG. 9 in addition to FIG. 1. FIG. 4 to FIG. 9 are cross-sectional views illustrating a state of the workpiece after performing a step of the method illustrated in FIG. 1.

As described above, in the step ST1 of the method MT, the wafer W is prepared in the processing container 12 of the plasma processing apparatus 10. Specifically, the wafer W is transferred to the inside of the processing container 12, and is placed on the electrostatic chuck ESC. Then, the wafer W is retained by the electrostatic chuck ESC.

Subsequently, in the method MT, the plurality of sequences SQ, each of which includes a step ST2, a step ST3, and a step ST4, are performed. In the step ST2, a plasma of the first processing gas is generated in the processing container 12. Specifically, in the step ST2, the first processing gas is supplied from the gas source group 40 to the inside of the processing container 12 at a predetermined flow rate. In addition, a pressure inside the processing container 12 is set to a predetermined pressure by the exhaustion device 50. In addition, a high-frequency wave from the first high-frequency power supply 62 is supplied to the lower electrode LE, and a high-frequency bias from the second high-frequency power supply 64 is supplied to the lower electrode LE. It should be noted that a high-frequency wave, which is a continuous wave, may be supplied from the first high-frequency power supply 62 to the lower electrode LE, or a pulse-modulated high frequency wave may be supplied from the first high-frequency power supply 62 to the lower electrode LE. In addition, a high-frequency bias, which is a continuous wave, may be supplied from the second high-frequency power supply 64 to the lower electrode LE, or a pulse-modulated high-frequency bias may be supplied from the second high-frequency power supply 64 to the lower electrode LE.

Figure 4:
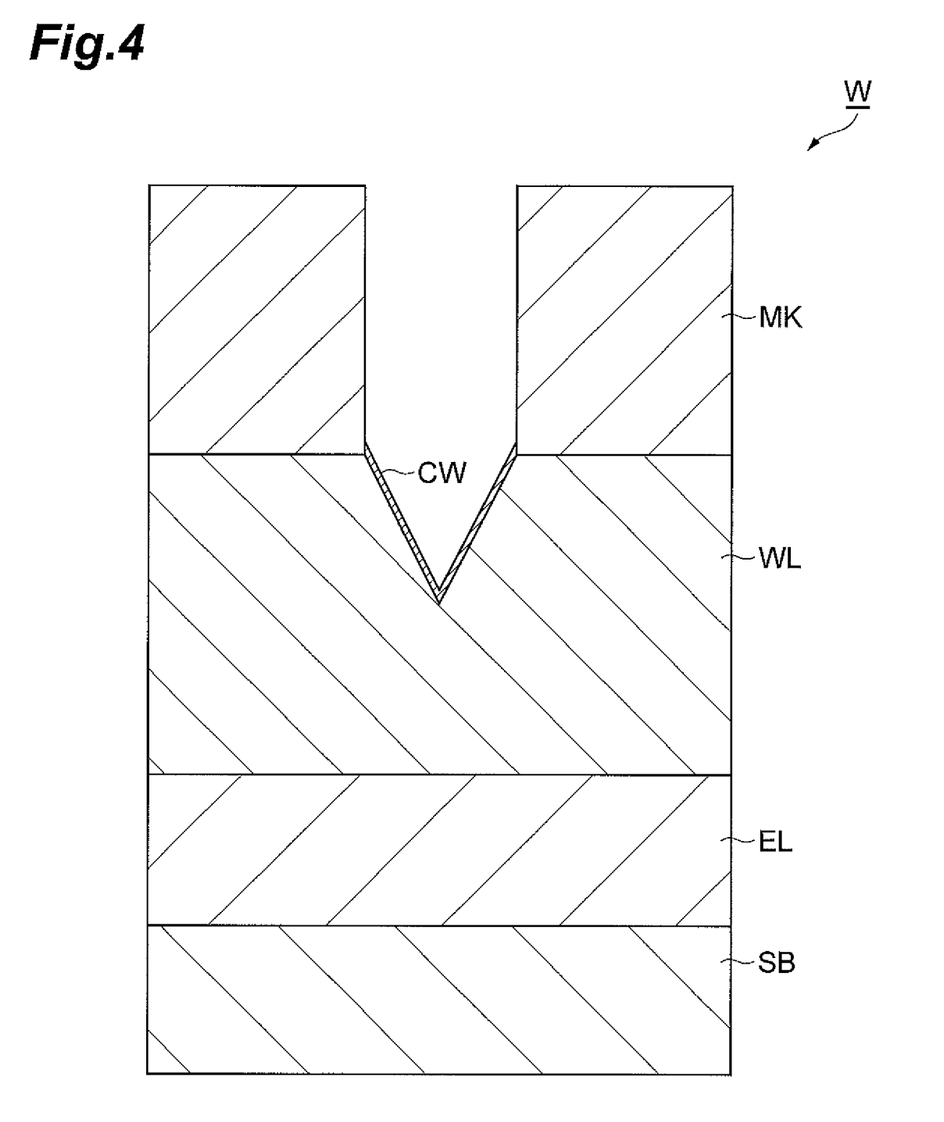
FIG. 4 is a cross-sectional view illustrating a state of the workpiece after performing a step of the method illustrated in FIG. 1.

As described above, the first processing gas contain chlorine. In the step ST2, tungsten and chlorine react with each other, and the tungsten-containing film WL is etched at a portion that is exposed from an opening of the mask MK, as illustrated in FIG. 4. In the etching of the step ST2, a reaction product of chlorine and tungsten, that is, tungsten chloride (for example, $WCl_6$) is generated. As illustrated in FIG. 4, the generated reaction product CW adheres to a surface of the wafer W, particularly, a surface of the tungsten-containing film WL. As a result, a shape of an opening, which is formed in the tungsten-containing film WL by etching in the step ST2, becomes a tapered shape.

In the subsequent step ST3, a plasma of the second processing gas is generated in the processing container 12. Specifically, in the step ST3, the second processing gas from the gas source group 40 is supplied to the inside of the processing container 12 at a predetermined flow rate. In addition, the pressure inside the processing container 12 is set to a predetermined pressure by the exhaustion device 50. In addition, a high-frequency wave from the first high-frequency power supply 62 is supplied to the lower electrode LE, and a high-frequency bias from the second high-frequency power supply 64 is supplied to the lower electrode LE. It should be noted that a high-frequency wave, which is a continuous wave, may be supplied from the first high-frequency power supply 62 to the lower electrode LE, or a pulse-modulated high frequency wave may be supplied from the first high-frequency power supply 62 to the lower electrode LE. In addition, a high-frequency bias, which is a continuous wave, may be supplied from the second high-frequency power supply 64 to the lower electrode LE, or a pulse-modulated high-frequency bias may be supplied from the second high-frequency power supply 64 to the lower electrode LE.

Figure 5:
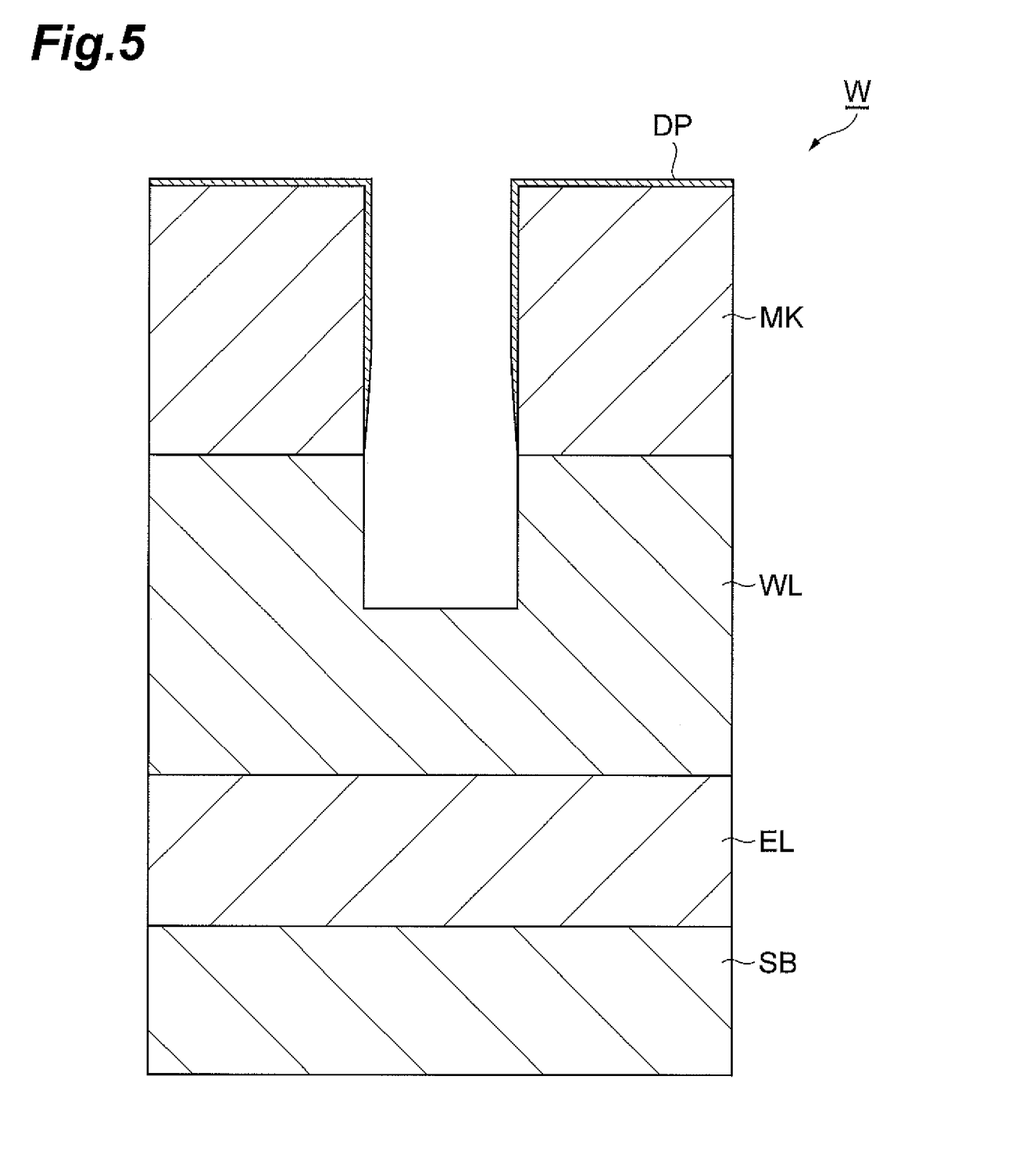
FIG. 5 is a cross-sectional view illustrating a state of the workpiece after performing a step of the method illustrated in FIG. 1.

As described above, the second processing gas contains fluorine. In the step ST3, a reaction product CW is etched, as illustrated in FIG. 5. That is, tungsten chloride and active species of fluorine react with each other, and thus the reaction product CW is etched. In addition, the tungsten-containing film WL is further etched through a reaction between the active species of fluorine and tungsten. In etching of the step ST3, tungsten fluoride (for example, $WF_6$) and chlorine are generated. The tungsten fluoride has a vapor pressure higher than a vapor pressure of tungsten chloride. That is, tungsten fluoride has volatility higher than that of tungsten chloride. Accordingly, the generated tungsten fluoride becomes a gas, and is easily exhausted together with the generated chlorine. Accordingly, as illustrated in FIG. 5, an opening having high verticality is formed in the tungsten-containing film WL.

In the subsequent step ST4, plasma of the third processing gas is generated in the processing container 12. Specifically, in the step ST4, the third processing gas is supplied from the gas source group 40 to the inside of the processing container 12 at a predetermined flow rate. In addition, the pressure inside the processing container 12 is set to a predetermined pressure by the exhaustion device 50. In addition, a high-frequency wave from the first high-frequency power supply 62 is supplied to the lower electrode LE, and a high-frequency bias from the second high-frequency power supply 64 is supplied to the lower electrode LE. It should be noted that a high frequency wave, which is a continuous wave, may be supplied from the first high-frequency power supply 62 to the lower electrode LE, or a pulse-modulated high frequency wave may be supplied from the first high-frequency power supply 62 to the lower electrode LE. In addition, a high-frequency bias, which is a continuous wave, may be supplied from the second high-frequency power supply 64 to the lower electrode LE, or a pulse-modulated high-frequency bias may be supplied from the second high-frequency power supply 64 to the lower electrode LE.

Figure 6:
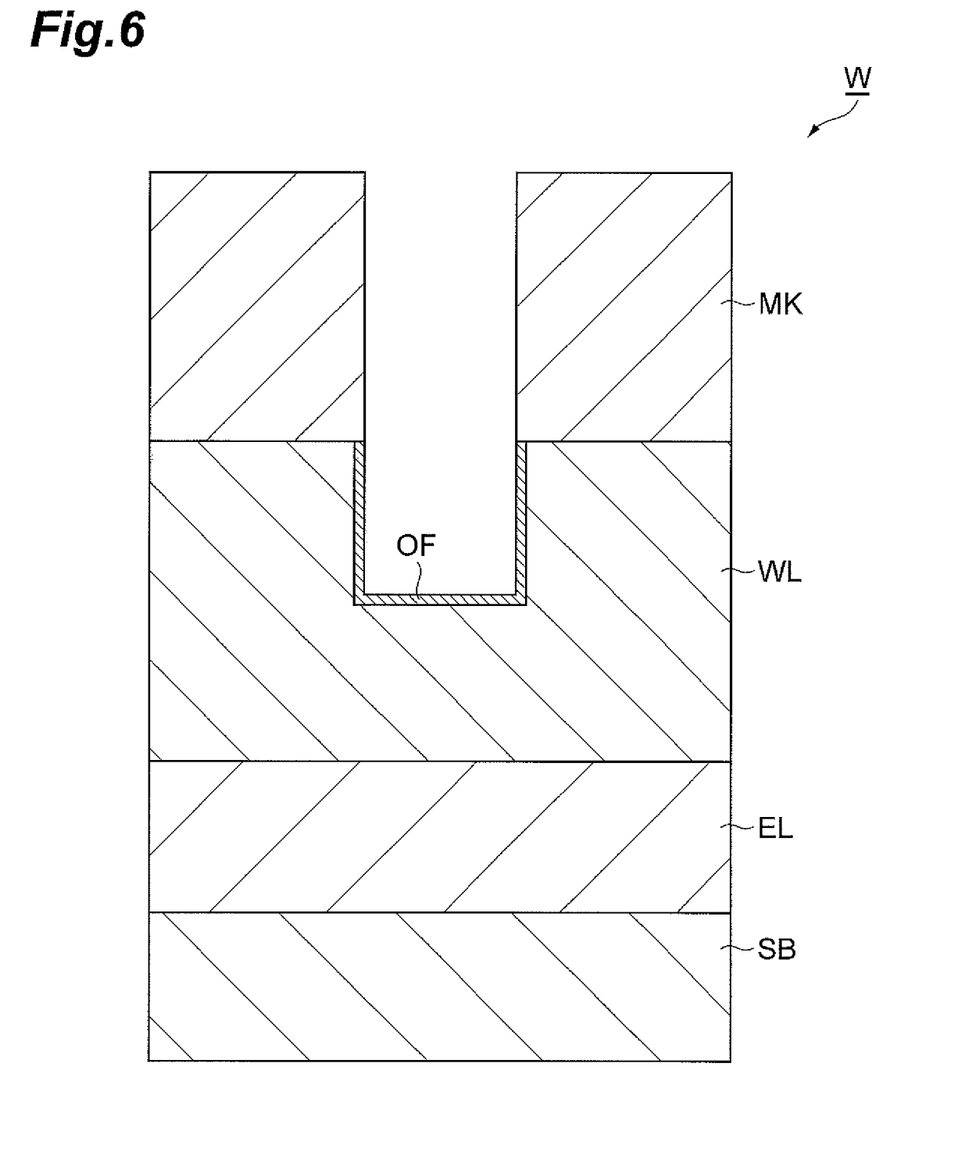
FIG. 6 is a cross-sectional view illustrating a state of the workpiece after performing a step of the method illustrated in FIG. 1.

As described above, the third processing gas contains oxygen. In the step ST4, a surface of the tungsten-containing film WL, that is, a wall surface defining an opening formed in the tungsten-containing film WL by etching, is oxidized, and thus an oxide film OF is formed, as illustrated in FIG. 6.

As illustrated in FIG. 1, in the method MT, whether or not a stop condition is satisfied is determined in the subsequent step STJ. For example, when the number of times of execution of the sequence SQ reaches a predetermined number of times, it is determined that the stop condition is satisfied. When it is determined in the step STJ that the stop condition is not satisfied, the sequence SQ is performed again.

Figure 7:
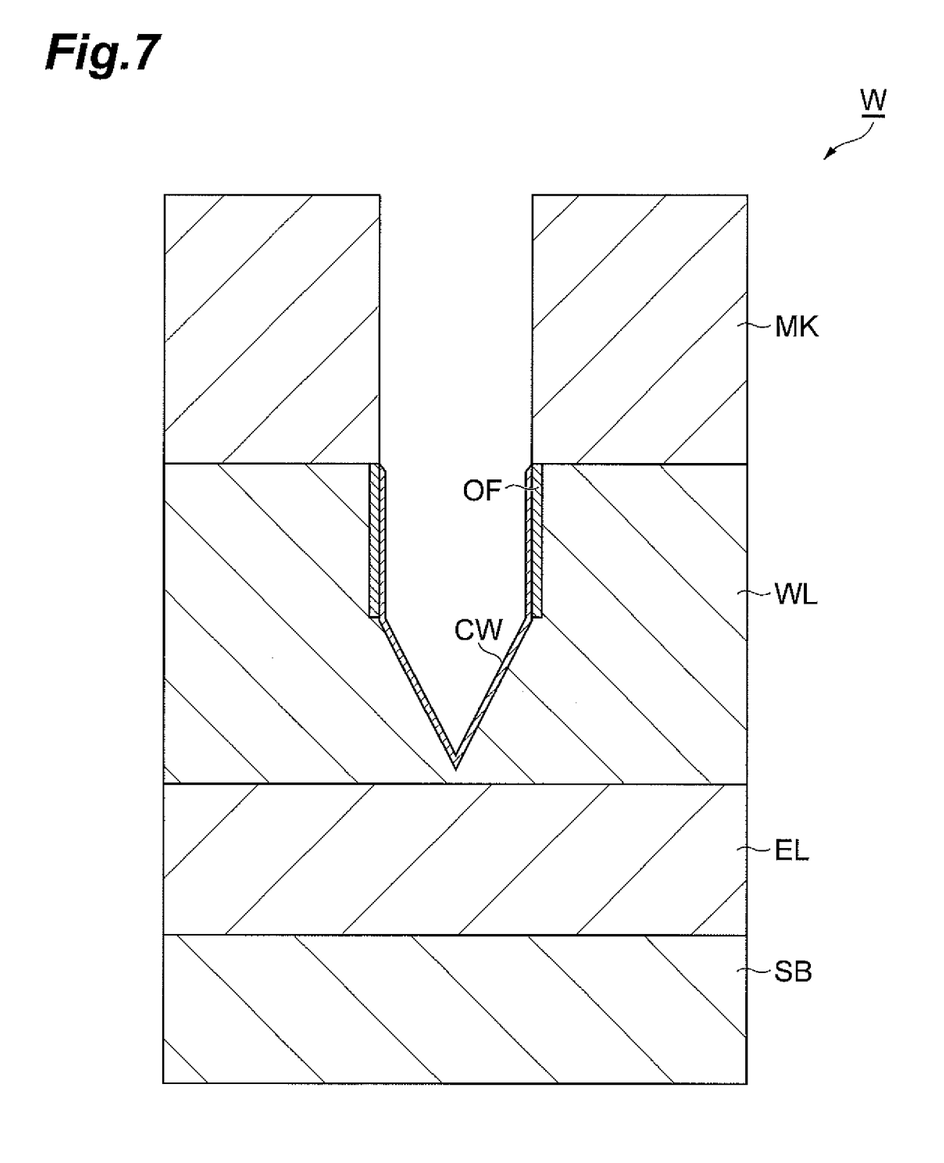
FIG. 7 is a cross-sectional view illustrating a state of the workpiece after performing a step of the method illustrated in FIG. 1.

Then, in the step ST2, the oxide film OF on a bottom surface defining the opening is preferentially etched with respect to the oxide film OF on a lateral surface defining the opening, due to a chlorine ion attraction effect. In addition, the tungsten-containing film WL is further etched, and a reaction product CW adheres to the surface of the tungsten-containing film WL. Then, the subsequent processes ST3 and ST4 are further performed.

Figure 8:
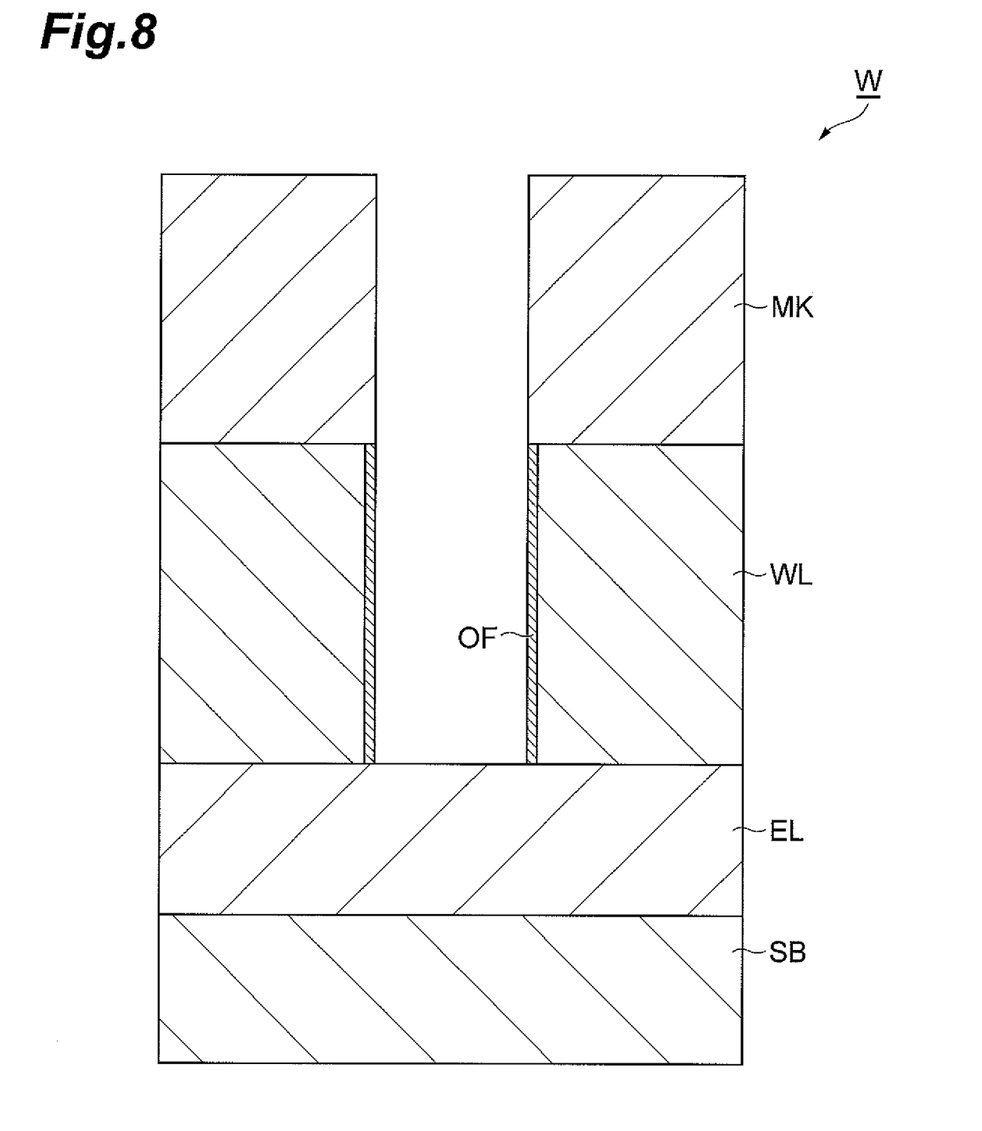
FIG. 8 is a cross-sectional view illustrating a state of the workpiece after performing a step of the method illustrated in FIG. 1.

When it is determined in the step STJ that the stop condition is satisfied, execution of the sequences SQ is completed. When execution of the sequences SQ is completed, an opening, from which the surface of the etching target layer EL is exposed, is formed in the tungsten-containing film WL, as illustrated in FIG. 8.

In the method MT, a step ST5 is performed next. In the step ST5, the etching target layer EL is etched. To this end, plasma of the fourth processing gas is generated in the processing container 12. Specifically, in the step ST5, the fourth processing gas from the gas source group 40 is supplied to the inside of the processing container 12 at a predetermined flow rate. In addition, the pressure inside the processing container 12 is set to a predetermined pressure by the exhaustion device 50. In addition, a high-frequency wave from the first high-frequency power supply 62 is supplied to the lower electrode LE, and a high-frequency bias from the second high-frequency power supply 64 is supplied to the lower electrode LE. It should be noted that a high-frequency wave, which is a continuous wave, may be supplied from the first high-frequency power supply 62 to the lower electrode LE, or a pulse-modulated high frequency wave may be supplied from the first high-frequency power supply 62 to the lower electrode LE. In addition, a high-frequency bias, which is a continuous wave, may be supplied from the second high-frequency power supply 64 to the lower electrode LE, or a pulse-modulated high-frequency bias may be supplied from the second high-frequency power supply 64 to the lower electrode LE.

Figure 9:
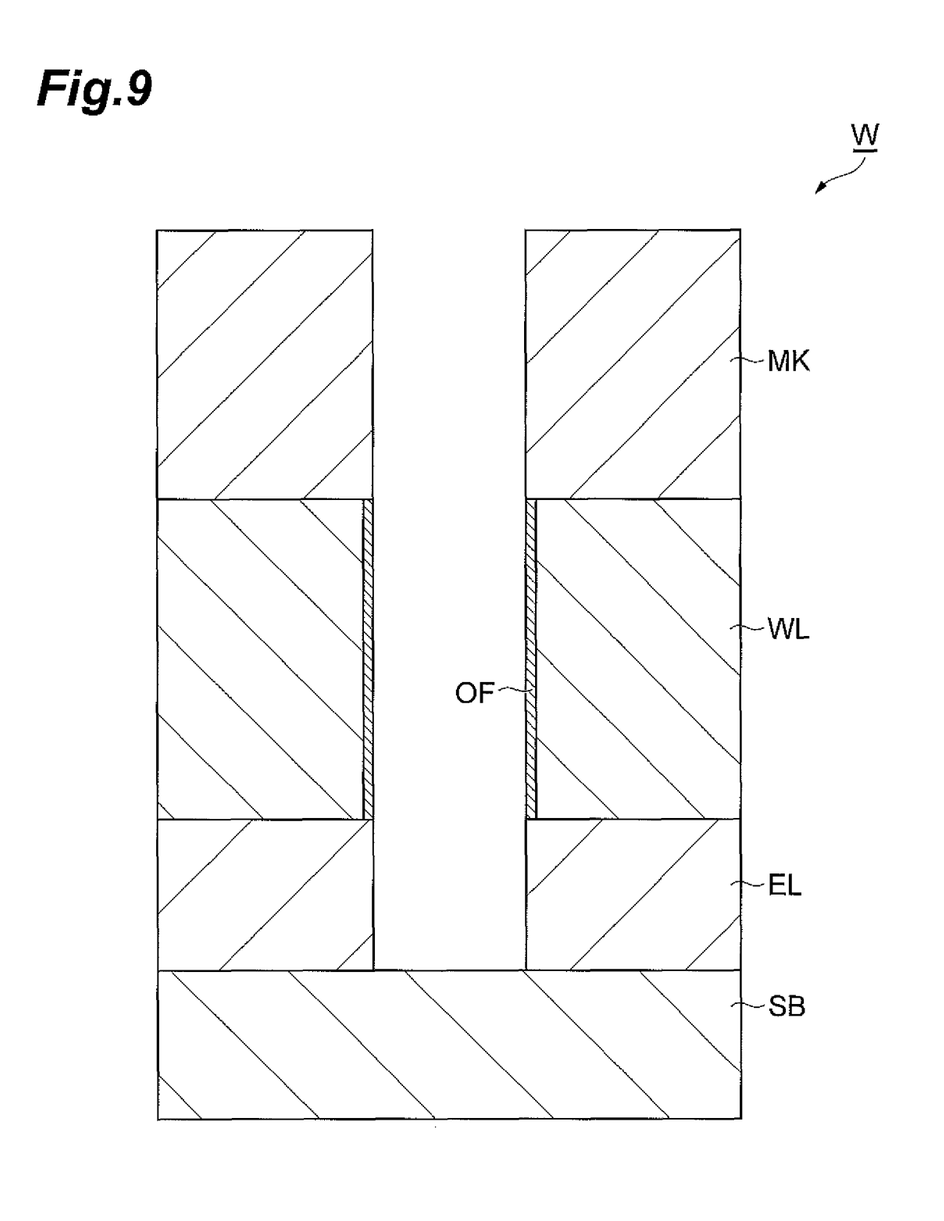
FIG. 9 is a cross-sectional view illustrating a state of the workpiece after performing a step of the method illustrated in FIG. 1.

As a result of execution of the step ST5, the etching target layer EL is etched at a portion that is exposed from the opening in the tungsten-containing film WL, as illustrated in FIG. 9.

In the method MT, tungsten fluoride, which easily volatilizes, is formed in the step ST3 from tungsten chloride generated in the step ST2. Accordingly, the reaction product during etching is easily exhausted. In addition, in the step ST4, the oxide film OF is formed on the wall surface defining the opening in the tungsten-containing film WL, and the oxide film OF on the bottom surface defining the opening is preferentially etched in the subsequent step ST2. That is, the oxide film OF on the lateral surface defining the opening is retained. Accordingly, the opening, which is formed in the tungsten-containing film WL, is prevented from being broadened in a lateral direction. According to the method MT based on the above-described principle, it is possible to form an opening having high verticality in the tungsten-containing film WL.

In one embodiment of the method MT, at least during execution of the step ST3, the pressure of the space inside the processing container 12 is set to a pressure of 20 mTorr (2.666 Pa) or lower. When the sequences SQ are performed at the pressure, exhaustion of tungsten fluoride generated in the step ST3 is promoted. In addition, during execution of the step ST2, the pressure of the space inside the processing container 12 may also set to a pressure of 20 mTorr (2.666 Pa) or lower.

In addition, in one embodiment of the method MT, the temperature of the wafer W may be set to a temperature of 50° C. or higher during execution of the sequences SQ. When the temperature of the wafer W is set to the temperature, gasification of tungsten fluoride is promoted, and exhaustion of tungsten fluoride is further promoted. As a result, it is possible to form an opening having higher verticality in the tungsten-containing film WL.

Hereinbefore, various embodiments have been described, but various modifications may be made without being limited to the above-described embodiments. For example, the above-described plasma processing apparatus 10 has a configuration in which the high frequency wave from the first high-frequency power supply 62 is supplied to the lower electrode LE, but the high frequency wave from the first high-frequency power supply 62 may be supplied to the upper electrode 30. In addition, an arbitrary plasma processing apparatus other than the plasma processing apparatus 10 may be used for performing the method MT. For example, an inductively-coupled plasma processing apparatus, or a plasma processing apparatus, which uses a surface wave such as a microwave, may be used for performing of the method MT.

Hereinafter, description will be given of Experiment Examples which were performed for evaluation of the method MT. It should be noted that the disclosure of this specification is not limited to Experiment Examples.

Experiment Example 1

In Experiment Example 1, a plurality of wafers having the configuration illustrated in FIG. 2 were prepared. Specifically, a plurality of wafers, each of which includes the tungsten-containing film WL having a film thickness of 300 nm, and the mask MK provided with a hole having a width of 30 nm, were prepared. The tungsten-containing film WL was a single film formed from only tungsten. In Experiment Example 1, the method MT was performed by using the plasma processing apparatus 10 under the following conditions to form a hole in the tungsten-containing film WL of the plurality of wafers. In addition, in Experiment Example 1, the numbers of times of execution of the sequence SQ for the plurality of wafers were adjusted to form holes having depths different from each other in the tungsten-containing films WL of the plurality of wafers, respectively.

<Conditions of Step ST2 in Experiment Example 1>
  Pressure inside the processing container 12: 10 mTorr (1.333 Pa)
  High-frequency wave of the first high-frequency power supply 62: 100 MHz
  Pulse-modulation frequency of the high-frequency wave of the first high-frequency power supply 62: 50 kHz
  Duty ratio in pulse modulation of the high frequency wave of the first high-frequency power supply 62: 50%
  High-frequency bias (continuous wave) of the second high-frequency power supply 64: 13.56 MHz
  Chlorine gas flow rate: 160 sccm
  Nitrogen gas flow rate: 50 sccm
  Oxygen gas flow rate: 30 sccm
  Temperature of a wafer: 50° C.
  Processing time: 6 seconds <Conditions of Step ST3 in Experiment Example 1>
  Pressure inside the processing container 12: 15 mTorr (2 Pa)
  High-frequency wave of the first high-frequency power supply 62: 100 MHz
  Pulse-modulation frequency of the high-frequency wave of the first high-frequency power supply 62: 10 kHz
  Duty ratio in pulse modulation of the high frequency wave of the first high-frequency power supply 62: 50%
  High-frequency bias (continuous wave) of the second high-frequency power supply 64: 13.56 MHz
  Nitrogen trifluoride gas flow rate: 15 sccm
  $CF_4$ gas flow rate: 30 sccm
  Oxygen gas flow rate: 50 sccm
  Temperature of a wafer: 50° C.
  Processing time: 5.5 seconds
<Conditions of Step ST4 in Experiment Example 1>
  Pressure inside the processing container 12: 100 mTorr (13.33 Pa)
  High-frequency wave (continuous wave) of the first high-frequency power supply 62: 100 MHz
  High-frequency bias (continuous wave) of second high-frequency power supply 64: 13.56 MHz
  Oxygen gas flow rate: 800 sccm
  Nitrogen gas flow rate: 100 sccm
  Temperature of a wafer: 50° C.
  Processing time: 5 seconds In addition, Comparative Experiment Example 1 was performed for comparison. In Comparative Experiment Example 1, a plurality wafers same as those in Experiment Example 1 were prepared. In Comparative Experiment Example 1, the process of forming a hole in the tungsten-containing film WL of the plurality of wafers was performed under the following conditions by using the plasma processing apparatus 10. In addition, in Comparative Experiment Example 1, the processing time was adjusted to form holes having depths different from each other in the tungsten-containing films WL of the wafers.

Figure 10:
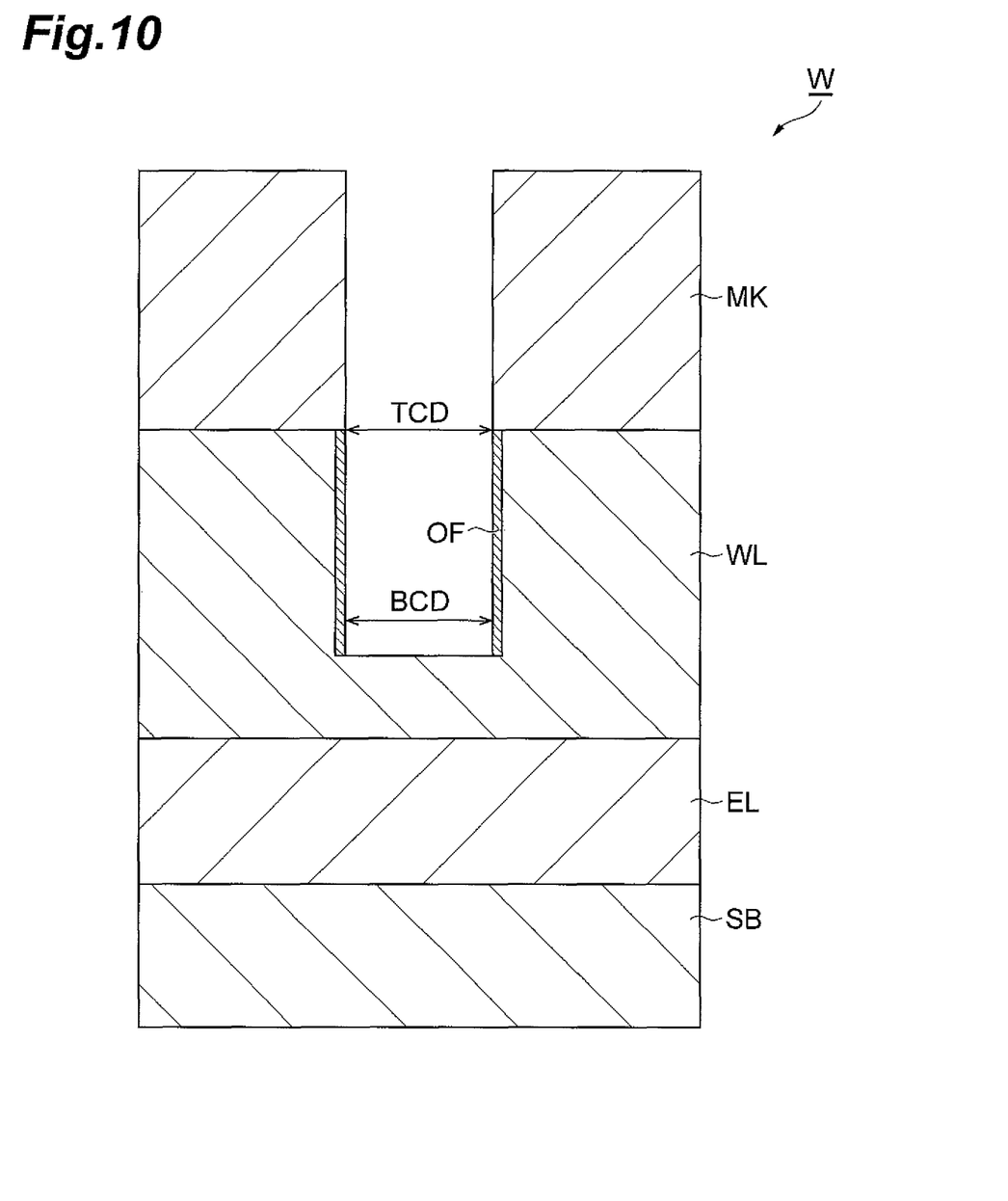
FIG. 10 is a view illustrating a width TCD and a width BCD determined in Experiment Example 1 and Comparative Experiment Example 1.
Figure 11:
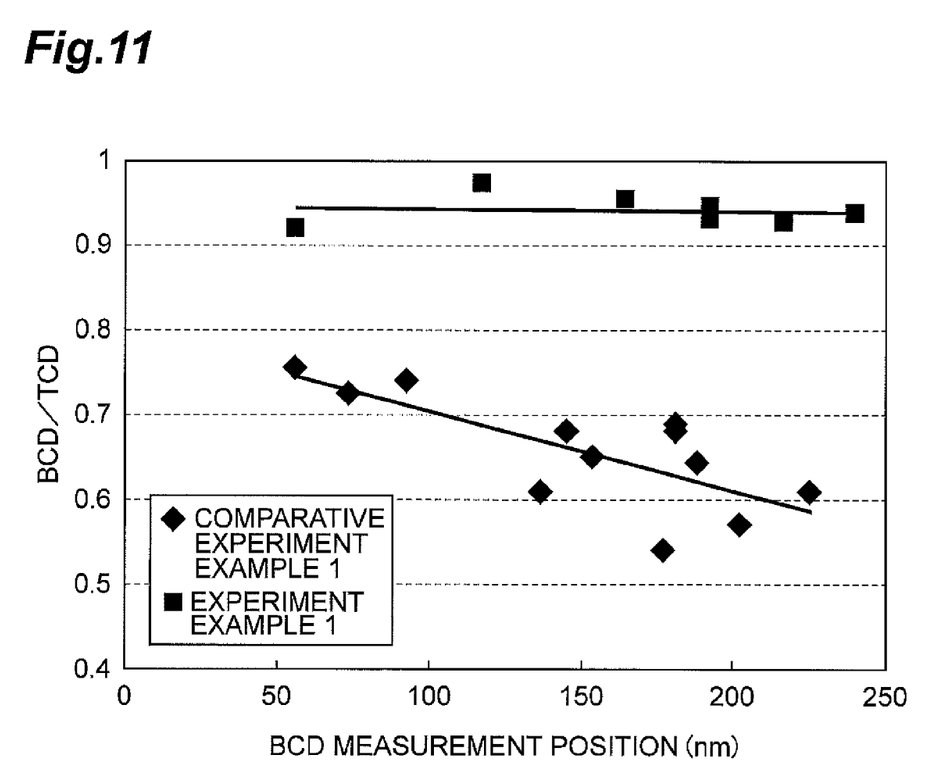
FIG. 11 is a graph illustrating results of Experiment Example 1 and Comparative Experiment Example 1.

<Processing Conditions in Comparative Experiment Example 1>
  Pressure inside the processing container 12: 10 mTorr (1.333 Pa)
  High-frequency wave (continuous wave) of the first high-frequency power supply 62: 100 MHz
  High-frequency bias of the second high-frequency power supply 64: 13.56 MHz
  Pulse-modulation frequency of the high-frequency bias of the second high-frequency power supply 64: 10 kHz
  Duty ratio in pulse modulation of the high-frequency bias of the second high-frequency power supply 64: 50%
  Chlorine gas flow rate: 185 sccm
  Temperature of a wafer: 60° C.
  Processing time: 120 seconds Then, in an opening formed in the tungsten-containing film WL of each of the wafers after processing in Experiment Example 1 and Comparative Experiment Example 1, a width TCD on an upper side and a width BCD on a bottom side were measured, as illustrated in FIG. 10. The width BCD was set as a width of the opening at a position spaced away from the bottom surface of the opening formed in the tungsten-containing film WL toward an upper side by 30 nm. In addition, BCD/TCD was calculated with respect to the opening formed in the tungsten-containing film WL of each of the wafers. Results are illustrated in a graph of FIG. 11. The horizontal axis of the graph of FIG. 11 represents a BCD measurement position in a depth direction of a hole formed in the tungsten-containing film WL, and the vertical axis represents BCD/TCD. BCD/TCD is a parameter representing that as a value thereof is close to 1, a hole having high verticality is formed. As illustrated in FIG. 11, in Comparative Experiment Example 1, that is, in etching using a chlorine gas, BCD/TCD of the opening formed in the tungsten-containing film WL was considerably smaller than 1. That is, in Comparative Experiment Example 1, a tapered opening having low verticality was formed. On the other hand, in Experiment Example 1, BCD/TCD was a value close to 1. Accordingly, in Experiment Example 1, a hole having high verticality was formed in the tungsten-containing film WL. Accordingly, in the method MT, it was confirmed that a hole having high verticality can be formed in the tungsten-containing film WL.

Experiment Example 2

In Experiment Example 2, a plurality of wafers same as those in Experiment Example 1 were prepared. In Experiment Example 2, the method MT was performed by using the plasma processing apparatus 10 under the following conditions to form a hole in the tungsten-containing film WL of the plurality of wafers. In addition, in Experiment Example 2, as temperatures of the plurality of wafers during execution of the sequence SQ, temperatures different from each other were set.

Figure 12:
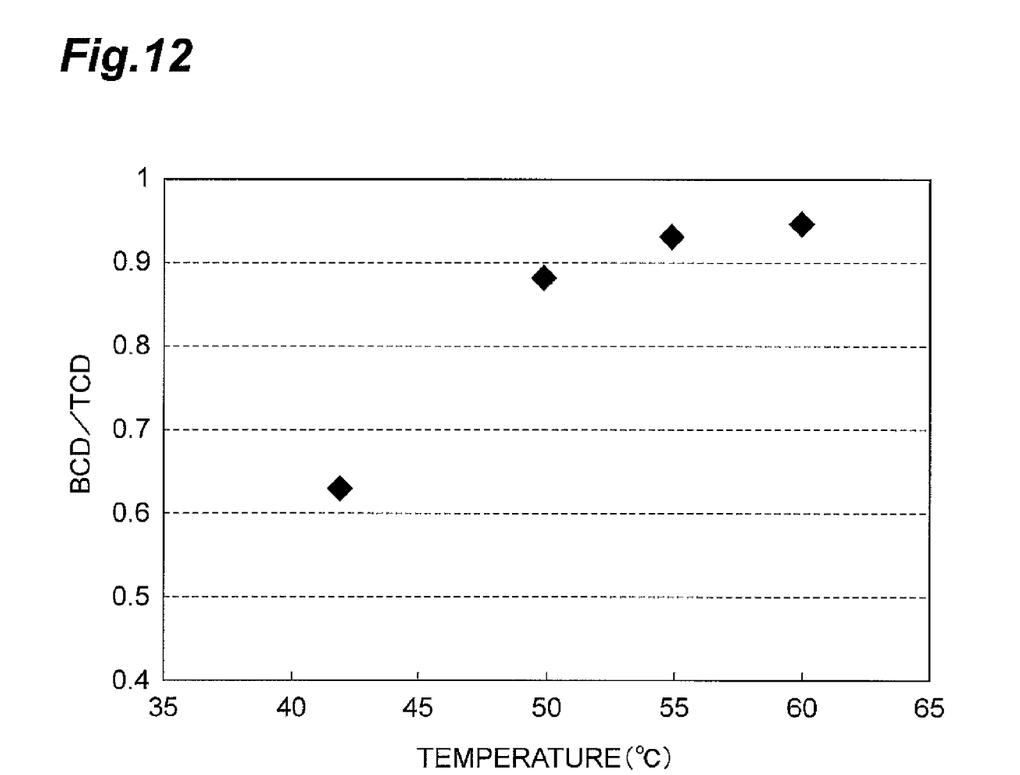
FIG. 12 is a graph illustrating a result of Experiment Example 2.

<Conditions of Sequence SQ>
  The number of times of execution of the sequence SQ: 12 times
<Conditions of Step ST2 in Experiment Example 2>
  Pressure inside the processing container 12: 10 mTorr (1.333 Pa)
  High-frequency wave of the first high-frequency power supply 62: 100 MHz
  Pulse-modulation frequency of the high-frequency wave of the first high-frequency power supply 62: 50 kHz
  Duty ratio in pulse modulation of the high-frequency wave of the first high-frequency power supply 62: 50%
  High-frequency bias (continuous wave) of the second high-frequency power supply 64: 13.56 MHz
  Chlorine gas flow rate: 160 sccm
  Nitrogen gas flow rate: 50 sccm
  Oxygen gas flow rate: 30 sccm
  Processing time: 6 seconds <Conditions of Step ST3 in Experiment Example 2>
   Pressure inside the processing container 12: 15 mTorr (2 Pa)
   High-frequency wave of the first high-frequency power supply 62: 100 MHz
   Pulse-modulation frequency of the high-frequency wave of the first high-frequency power supply 62: 10 kHz
   Duty ratio in pulse modulation of the high-frequency wave of the first high-frequency power supply 62: 50%
   High-frequency bias (continuous wave) of the second high-frequency power supply 64: 13.56 MHz
   Nitrogen trifluoride gas flow rate: 15 sccm
   $CF_4$ gas flow rate: 30 sccm
   Oxygen gas flow rate: 50 sccm
   Processing time: 5.5 seconds
<Conditions of Step ST4 in Experiment Example 2>
   Pressure inside the processing container 12: 100 mTorr (13.33 Pa)
   High-frequency wave (continuous wave) of the first high-frequency power supply 62: 100 MHz
   High-frequency bias (continuous wave) of second high-frequency power supply 64: 13.56 MHz
   Oxygen gas flow rate: 800 sccm
   Nitrogen gas flow rate: 100 sccm
   Processing time: 5 seconds Then, BCD/TCD was calculated with respect to the opening formed in the tungsten-containing film WL of each of the plurality of wafers. Results are illustrated in a graph of FIG. 12. The horizontal axis of the graph of FIG. 12 represents a temperature of the wafer during execution of the sequence SQ, and the vertical axis represents BCD/TCD. As illustrated in FIG. 12, in a case where the temperature of the wafer during execution of the sequence SQ was 50° C. or higher, BCD/TCD was approximately 0.9, or a value greater than 0.9. Accordingly, it was confirmed that a hole having high verticality was formed in a case where the temperature of the wafer during execution of the sequence SQ was 50° C. or higher.

From the foregoing description, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A method of processing a workpiece having a tungsten-containing film and a mask provided on the tungsten-containing film, the method comprising:
   preparing the workpiece in a processing container of a plasma processing apparatus;
   generating a plasma of a first processing gas, which contains chlorine, in the processing container;
   generating a plasma of a second processing gas, which contains fluorine, in the processing container, subsequently to said generating a plasma of a first processing gas; and
   generating a plasma of a third processing gas, which contains oxygen, in the processing container, subsequently to said generating a plasma of a second processing gas; and
   wherein a plurality of sequences, each of which includes said generating a plasma of a first processing gas, said generating a plasma of a second processing gas, and said generating a plasma of a third processing gas, are performed.

2. The method according to claim 1, wherein in the plurality sequences, a temperature of the workpiece is set to a temperature of 50° C. or higher.

3. The method according to claim 1, wherein the first processing gas includes a chlorine gas.

4. The method according to claim 3, wherein the first processing gas further includes a nitrogen gas and/or an oxygen gas.

5. The method according to claim 1, wherein the second processing gas includes at least one of a fluorocarbon gas and a nitrogen trifluoride gas.

6. The method according to claim 5, wherein the second processing gas further includes an oxygen gas.

7. The method according to claim 1, wherein the third processing gas includes an oxygen gas.

8. The method according to claim 7, wherein the third processing gas further includes a nitrogen gas.

9. The method according to claim 1, wherein said generating a plasma of a second processing gas, a pressure of a space inside the processing container is set to a pressure of 2.666 Pa or lower.

10. method according to claim 1, wherein
   the workpiece further has a polycrystal silicon layer, and the tungsten-containing film is provided on the polycrystal silicon layer, and
   the method further comprises etching the polycrystal silicon layer.

11. The method according to claim 1, wherein
   said generating a plasma of a first processing gas forms a reaction product of tungsten chloride, which adheres to a surface of the tungsten-containing film,
   in said generating a plasma of a second processing gas, the reaction product is etched by reaction between the tungsten chloride and active species of fluoride to generate tungsten fluoride and chlorine, and
   said generating a plasma of a third processing gas oxidizes the surface of the tungsten-containing film.

* * * * *